United States Patent [19]
Curry, II et al.

[11] Patent Number: 5,137,597
[45] Date of Patent: Aug. 11, 1992

[54] FABRICATION OF METAL PILLARS IN AN ELECTRONIC COMPONENT USING POLISHING

[75] Inventors: John W. Curry, II; Ian Y. K. Yee, both of Austin, Tex.

[73] Assignee: Microelectronics and Computer Technology Corporation, Austin, Tex.

[21] Appl. No.: 683,897

[22] Filed: Apr. 11, 1991

[51] Int. Cl.$^5$ .......................... B44C 1/22; C23F 1/00
[52] U.S. Cl. ................................. 156/636; 156/637; 156/644; 156/645; 156/651; 156/656; 156/659.1; 156/902
[58] Field of Search ............... 156/636, 637, 644, 645, 156/651, 652, 655, 656, 659.1, 664, 668, 902; 51/281 R, 317; 437/203, 228, 245; 29/874, 884

[56] References Cited

U.S. PATENT DOCUMENTS

| | | | |
|---|---|---|---|
| 4,520,041 | 5/1985 | Aoyama et al. | 156/656 X |
| 4,702,792 | 10/1987 | Chow et al. | 156/628 |
| 4,735,679 | 4/1988 | Lasky | 156/636 |
| 4,793,895 | 12/1988 | Kaanta et al. | 156/627 |
| 4,810,332 | 2/1989 | Pan | 204/15 |
| 4,874,463 | 10/1989 | Koze et al. | 156/645 |
| 4,879,258 | 11/1989 | Fisher | 437/225 |
| 4,936,950 | 6/1990 | Doan et al. | 156/656 X |
| 4,944,836 | 7/1990 | Beyer et al. | 156/645 |
| 4,956,313 | 9/1990 | Cote et al. | 156/656 X |
| 4,985,306 | 1/1991 | Morizane et al. | 428/410 |
| 5,084,419 | 1/1992 | Sakao | 437/228 |

OTHER PUBLICATIONS

Bennett et al., "Selective Planarization Process and Structure," IBM Technical Disclosure Bulletin, vol. 27, No. 4B, pp. 2560-2563, Sep. 1984.

Koburger, "Trench Planarization Technique," IBM Technical Disclosure Bulletin, vol. 27, No. 6, pp. 3242-3243, Nov. 1984.

Hamaguchi et al., "Hydrostatic Float Polishing for Wafer Preparation," Review of Scientific Instruments, vol. 55, No. 11, pp. 1867-1868, Nov. 1984.

Mutter, "Choice Stop Material for Chemical/Mechanical Polish Planarization," IBM Technical Disclosure Bulletin, vol. 27, No. 8, pp. 4642, Jan. 1985.

Beyer et al., "Class Ianarization by Stop Layer Polishing," IBM Technical Disclosure Bulletin, vol. 27, No. 8, pp. 4700-4701, Jan. 1985.

Barson et al., "Chemical Vapor Deposited Device Isolation With Chemical/Mechanical Planarization," IBM Technical Disclosure Bulletin, vol. 29, No. 2, pp. 557-579, Jul. 1986.

Surfacetech Review, Rodel Products Corp. vol. 1, Issue 1, Dec. 1986.

Surfacetech Review, Rodel Products Corp., vol. 1, Issue 2, Mar. 1987.

Surfacetech Review, Rodel Products Corp., vol. 1, Issue 3, Sep. 1987.

Surfacetech Review, Rodel Products Corp., vol. 1, Issue 4, Feb. 1988.

Surfacetech Review, Rodel Products Corp., vol. 1, Issue 5, Oct. 1988.

Riley et al., "Planarization of Dielectric Layers for Multilevel Metallization," Transactions on Semiconductor Manufacturing, vol. 1, No. 4, pp. 154-156, Nov. 1988.

Surfacetech Review, Rodel Products Corp., vol. 1, Issue 6, May 1989.

Surfacetech Review, Rodel Products Corp., vol. 1, Issue 7, Oct. 1989.

Surfacetech Review, Rodel Products Corp., vol. 1, Issue 8, Mar. 1990.

*Primary Examiner*—William A. Powell
*Attorney, Agent, or Firm*—David M. Sigmond

[57] ABSTRACT

A method for fabricating metal pillars in an electronic component. The method includes providing a base with spaced vias in a top surface, depositing an electrically conductive metal into the vias and over the top surface of the base so that a metal layer with an uneven top surface forms over the base, and planarizing the metal by polishing. The polishing can remove the entire metal layer leaving metal pillars in and aligned with the base. Or the polishing can be completed before removing the metal layer and metal above the base between the vias can be etched to form metal pillars with uniform heights which extend above the base. The invention is well suited for fabricating high-density multilayer copper/-polyimide electrical interconnects.

22 Claims, 6 Drawing Sheets

FABRICATION OF METAL PILLARS IN AN ELECTRONIC COMPONENT USING POLISHING

BACKGROUND OF THE INVENTION

The present invention relates to the fabrication of metal pillars in dielectrics, and more particularly to using polishing in the construction of spaced vertical metal pillars with planar tops and uniform heights either in and aligned with or extending above the dielectric layer of an electrical interconnect structure.

Current multi-chip circuitry design requires the attachment of numerous integrated circuit chips to high density electrical interconnects. The electrical interconnects normally include surface pads on a dielectric for bonding to surface mounted chips, and metal lines buried in the dielectric for electrically connecting selected pads. Frequently polyimide is used as the dielectric and copper is used as the metal. It is also common to stack up separate orthogonal layers of copper lines in the dielectric and to provide inter-layer connections (e.g. for lines-to-lines or lines-to-pads) by filling inter-layer holes or vias with a conductive metal. For instance, vertical inter-layer vias can be filled with copper, nickel or nickel alloys to form metal pillars in the dielectric. In such a structure the fabrication of metal pillars becomes a critical step in the overall construction of the electrical interconnect.

There are numerous techniques in the prior art for fabricating metal pillars in the dielectric of an electrical interconnect. Additive techniques include stacking up the pillars and then coating the pillars with a dielectric; whereas in substractive approaches a layer of dielectric is provided, vias are formed in the top of the dielectric and then metal is deposited into the vias. Methods of metallic deposition include electroless plating, electroplating, sputtering, and evaporation. Nevertheless., there is a continuing need to reduce process steps and lower fabrication costs.

SUMMARY OF THE INVENTION

An object of the present invention is to deposit metal into vias and over a top surface of an electronic component, and then apply polishing to the metal layer in order to planarize a surface. In one embodiment the metal in the vias is in and aligned with the top surface after polishing. In another embodiment the polishing leaves a portion of the metal layer over the component and is followed by a selective etch so that metal pillars with uniform heights extend above the component. A further object of the present invention is to fill vias in a dielectric with metal by blanket plating without requiring localized plating such as by photolithography at the vias.

Another object of the present invention is to form spaced metal pillars with uniform heights which may be either in and aligned with or extend above the top surface of a dielectric.

, A feature of the present invention includes providing a dielectric with spaced vias in a top surface, depositing an electrically conductive metal into the vias and over the top surface of the dielectric so that metal pillars form in the vias and a metal layer forms over the top surface of the dielectric, and planarizing the metal by polishing so that the metal layer is removed and the planar tops of the metal pillars are in and aligned with the top surface of the dielectric.

An additional feature of the present invention is to provide a method for fabricating metal pillars in an electronic component, including the sequential steps of providing a base with spaced vias in the top surface of the base, depositing an electrically conductive metal into the vias and over the top surface of the base so that a layer of the metal with an uneven top surface is formed over the top surface of the base, planarizing the top surface of the metal by polishing without removing all the metal over the top surface of the base, and removing metal above the top surface of the base between the vias thereby forming separate metal pillars in the base which extend above the top surface of the base.

Another feature of the present invention is to provide a method for fabricating metal pillars in a multilayer electrical interconnect, including the sequential steps of providing a planar layer of a first polymer dielectric on a base, forming a plurality of first vertical vias spaced from one another in the top of the first polymer, depositing a first electrically conductive metal into the first vias and on top of the first polymer so that the first metal fills the first vias and forms a first metal layer with an uneven top over the top of the first polymer, applying a first rotating pad and a first slurry to the top of the first metal to remove all the first metal above the top of the first polymer and to planarize the top of the electrical interconnect, removing the first pad and the first slurry from the electrical interconnect, providing a planar layer of a second polymer dielectric on top of the electrical interconnect, forming a plurality of second vertical vias spaced from one another in the top of the second polymer wherein each second vertical via exposes at least a portion of the first metal in a single underlaying first vertical via, depositing a second electrically conductive metal into the second vias and on top of the second polymer so that the second metal contacts the exposed first metal and fills the second vias and forms a second metal layer with an uneven top over the top of the second polymer, applying a second rotating pad and a second slurry to the top of the second metal to planarize the top of the second metal without contacting the pad to the top of the second polymer, removing the second pad and the second slurry from the second metal, applying a photoresist mask over the top of the second metal, forming openings in the mask to expose portions of the second metal between the second vias, etching the exposed second metal above the second polymer between the second vias through the mask openings with a wet chemical etchant, and stripping the mask so that the first and unetched second metals form spaced vertical metal pillars in the first and second polymers which extend above the top of the second polymer.

An advantage of the present invention is the ability to form vertical metal pillars with planarized tops and uniform heights in and extending above a dielectric with a single metal that is deposited in a single step.

Another advantage of the present invention is the reduction of steps needed to form vertical metal pillars with uniform heights in a dielectric.

Further objects, features and advantages Will be apparent from the following description of presently preferred embodiments of the invention, given for the purpose of disclosure and taken in conjunction with the accompanying drawings.

DETAILED DESCRIPTION OF PREFERRED EMBODIMENTS

The present invention for fabricating metal pillars in an electronic component by polishing is now described. While the present invention is applicable to a wide variety of electronic components with substantially planar layers, such as integrated circuits, multi-chip-modules, printed wiring boards and, for illustration purposes, a high density electrical interconnect as described herein.

Referring now to FIGS. 1-11, fragmentary elevational views in cross-section illustrate successive manufacturing stages for fabricating metal pillars in an electrical interconnect in accordance with one embodiment of the present invention.

Figure 1:
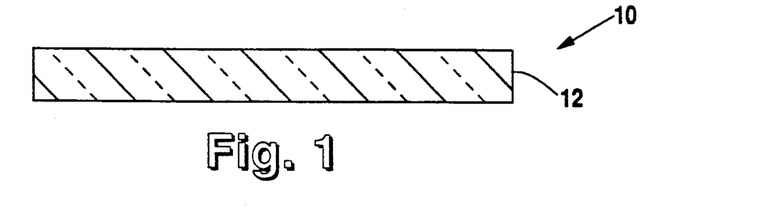
FIGS. 1-11 are fragmentary elevational views in cross-section illustrating successive manufacturing stages for fabricating metal pillars extending above a dielectric layer in accordance with one embodiment of the present invention.

In FIG. 1 reference numeral 10 generally indicates an electrical interconnect. Interconnect 10 is fabricated on a base 12. Preferably base 12 is a ceramic, such as alumina ceramic or glass ceramic. Other suitable base materials include silicon, various metals, organic or inorganic insulators, an integrated circuit, or a preceding layer if electrical interconnect 10 is a multilevel structure.

Figure 2:
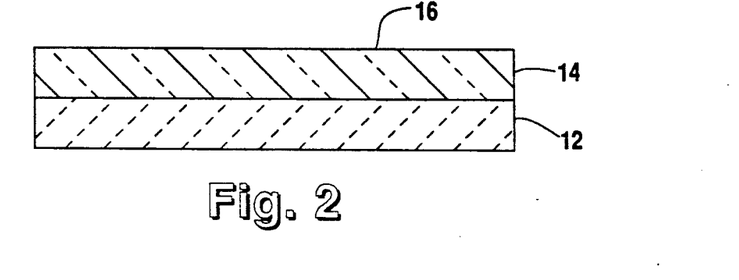

In FIG. 2 base 12 is covered with a layer of dielectric 14 with a smooth planar top surface 16. The dielectric may be radiation sensitive, curable, or activated. Preferred dielectrics are radiation curable epoxies or polymers. Benzocyclobutene and polyimide are also acceptable dielectrics. For example a 10 micron layer of polished planarized radiation sensitive polyimide can be provided.

Figure 3:
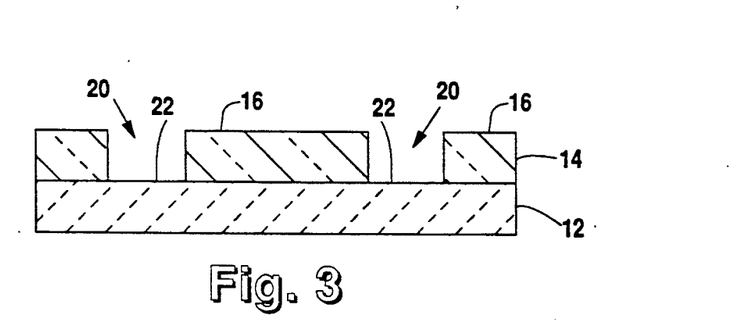

In FIG. 3 vertical openings or vias 20 are formed in top surface 16 of dielectric 14 and extend to exposed portions 22 of base 12. Numerous well known substractive techniques can form vias in a layer of dielectric. For example, a radiation sensitive polyimide dielectric can be covered with a patterned photoresist mask, subjected to radiation through the mask, separated from the mask, and then etched to create vias at the unexposed (masked) polyimide. Additional details on via formation in a dielectric are described in U.S. Pat. No. 5,091,339 filed Jul. 23, 1990 entitled "Trenching Techniques For Forming Vias And Channels In Multilayer Electrical Interconnects" by D. Carey, the disclosure for which is incorporated herein by reference.

Figure 4:
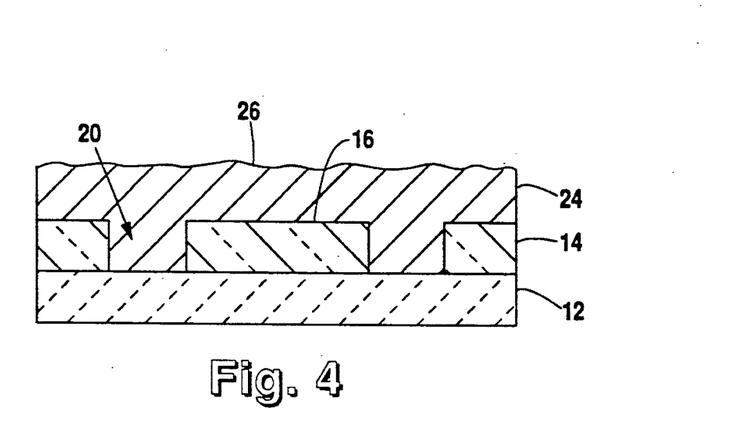

In FIG. 4 an electrically conductive metal 24 is deposited into vias 20 and over dielectric surface 16. Acceptable methods for metallic deposition generally include electrolytic plating, electroless plating, coating and sputtering, as well as combinations thereof. Plating is generally preferred for interconnect 10. Suitable metals generally include copper, nickel, nickel-alloys, gold, silver, aluminum, titanium, and chromium. Copper or a nickel alloy is generally preferred for interconnect 10. If a copper metal 24 is deposited into a polyimide dielectric 14 then the copper may interdiffuse copper into the polyimide. This may or may not be a significant problem depending on the thickness of the copper in the vias. The interdiffusion problem can be avoided by forming a nickel diffusion barrier between the copper and the polyimide. Returning to the example, metal 24 has a rough uneven top surface 26, which is not normally acceptable for electronic component fabrication.

Figure 5:
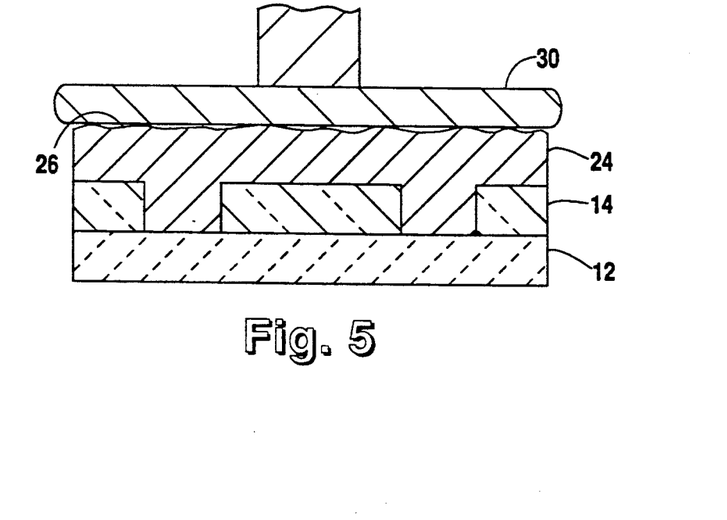

In FIG. 5 the top 26 of metal 24 is planarized by polishing. Polishing can be mechanical or chemical-mechanical. The use of polishing merely to achieve planarization as part of a processing sequence is well known in the art; see, for instance, C. W. Koburger, "Trench Planarization Technique," *IBM Technical Disclosure Bulletin*, Vol. 27, No. 6, pp. 3242-3243 (November 1984) and K. D. Beyer et al., "Glass Planarization By Stop-Layer Polishing," *IBM Technical Disclosure Bulletin*, Vol. 27, No. 8, pp. 4700-4701 (January 1985), the disclosures for which are hereby incorporated by reference. Polishing may be performed by a uniform mechanical polishing comprising rotating pad 30 and a slurry (not shown) to grind metal 24 from surface 26. Pad 30 can be a blown polyurethane pad. For illustration purposes, pad 30 is composed of a felt fiber fabric impregnated with polyurethane. Prior to impregnation with polyurethane pad 30 is soft. The amount of polyurethane impregnation determines how hard pad 30 will become, that is, whether pad 30 is relatively hard or soft. While the hardness of pad 30 is a matter of degree, it is useful for discussion purposes to categorize the pad as a "hard pad" or a "soft pad." A soft pad is more prone to conform with surface unevenness. However, a hard pad is more likely to tear-away metal 24 and, quite possibly, destroy the electrical interconnect 10. Furthermore, a hard pad creates a rougher surface finish, and may not distribute slurry on the metal as readily as a soft pad. Therefore, the selection of the best pad depends on requirements such as surface planarity, surface smoothness, the metal to be polished, and the slurry employed. Conventional polishing pads for silicon and gallium-arsenide are well known to those skilled in the art, and can be obtained from Rodel Products Corp. or Rippey Corp. A slurry specific to the type of metal 24 can be dispensed onto the rotating pad 30 to assist with the polishing. Slurries used for various metals include colloidal silica, alumina, etchants, and oxidizers. The particular slurry employed is often a critical factor in the polishing step.

Figure 6:
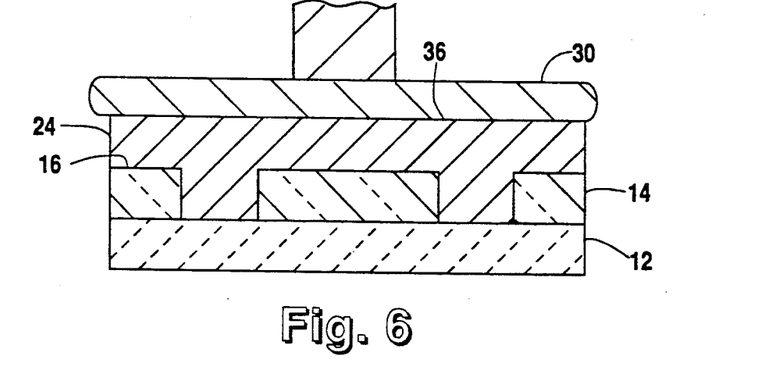
Figure 7:
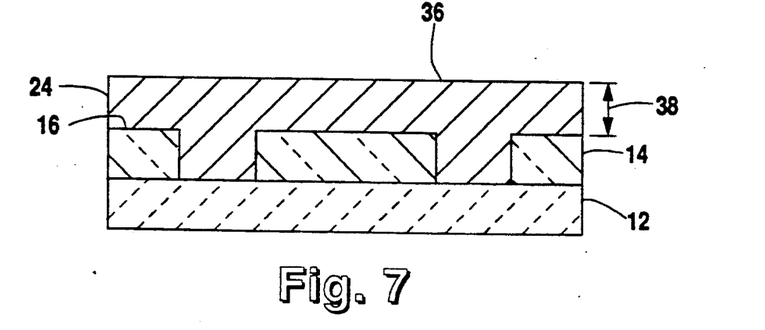

In FIG. 6 polishing is continued until metal 24 has a smooth, planar top surface 36. In FIG. 7 pad 30 is retracted and pad 30 and the slurry are removed from electrical interconnect 10. It is critical to note that not all of the metal 24 above dielectric top surface 16 is removed. Instead, planar metal surface 36 extends a distance 38 above surface 16 and thereby prevents pad 30 from contacting surface 16. Furthermore, if metal 24 covers the entire surface 16, then the slurry is also prevented from contacting surface 16 as polishing occurs.

Figure 8:
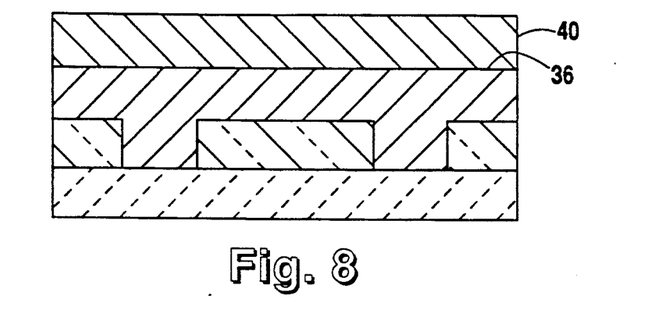
Figure 9:
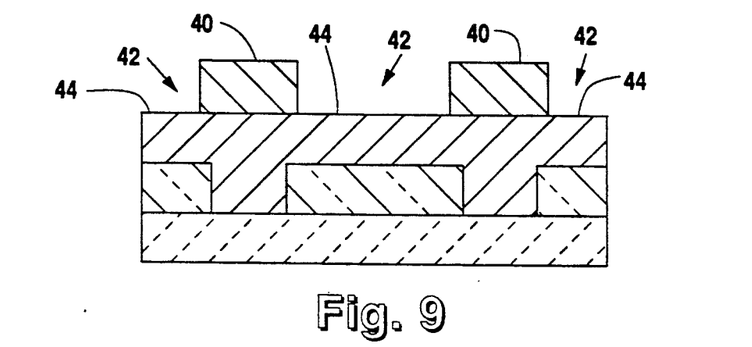
Figure 10:
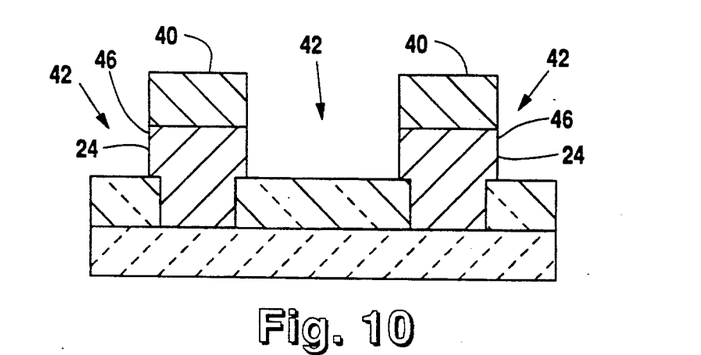
Figure 11:
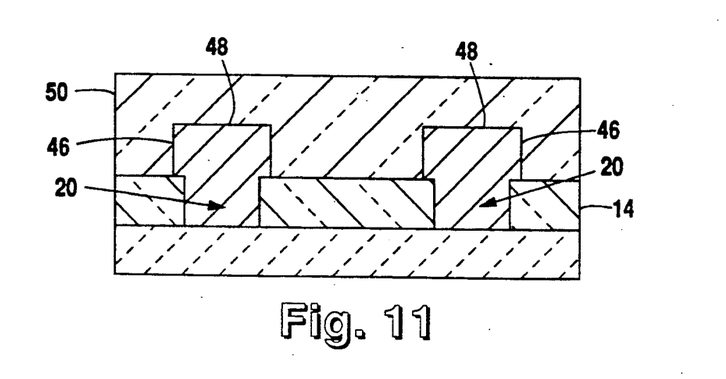

In FIG. 8 a layer of photoresist 40 is applied to metal surface 36 in order to provide an etch mask. In FIG. 9 photoresist 40 is patterned by conventional photolithography to form mask openings 42 between vias 20. Mask openings 42 expose the underlaying metal portions 44. In FIG. 10 exposed metal portions 44 are removed, for instance by a convention wet chemical etchant applied through mask openings 42. The remaining unetched metal 24 above surface 22 of dielectric 14 now forms metal pillars 46. Pillars 46 fill vias 20 and extend above top dielectric surface 16. In FIG. 11 photoresist 40 is removed by stripping. The tops 48 of metal pillars 46 are planar and have uniform heights. Preferably an additional layer of polyimide 50 is now coated over interconnect 10.

Referring now to FIGS. 12-17, shown are fragmentary elevational views in cross-section illustrating successive manufacturing stages for fabricating metal pillars in an electrical interconnect in accordance with another embodiment of the present invention, wherein like parts to FIGS. 1-11 are similarly numbered with the addition of the suffix "a". In this embodiment, the metal pillars will be in and aligned with surface 16 instead of extending above surface 16.

Figure 12:
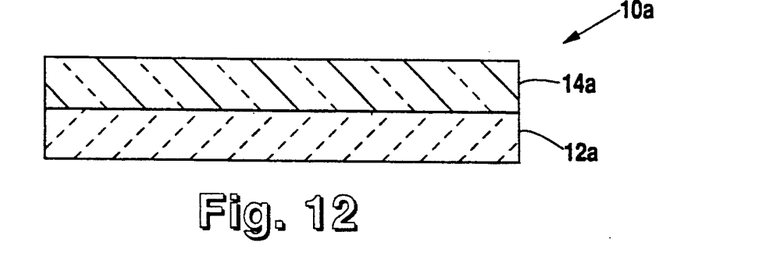
FIGS. 12-17 are fragmentary elevational views in cross-section illustrating successive manufacturing stages for fabricating metal pillars in and aligned with a dielectric layer in accordance with another embodiment of the present invention.
Figure 13:
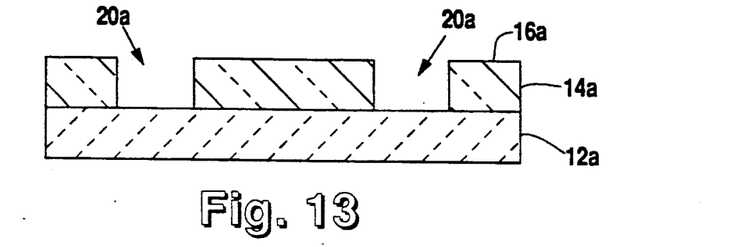
Figure 14:
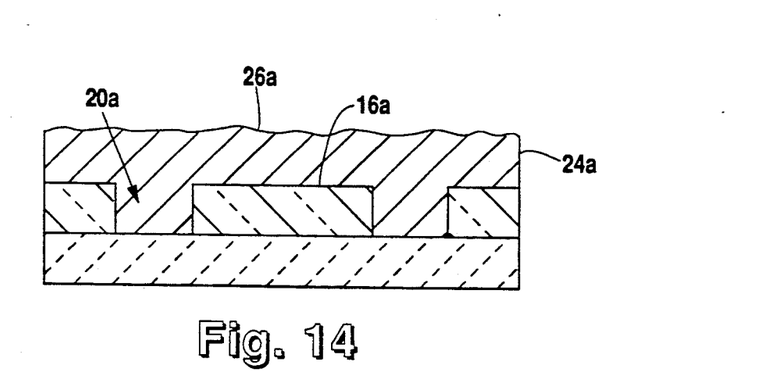
Figure 15:
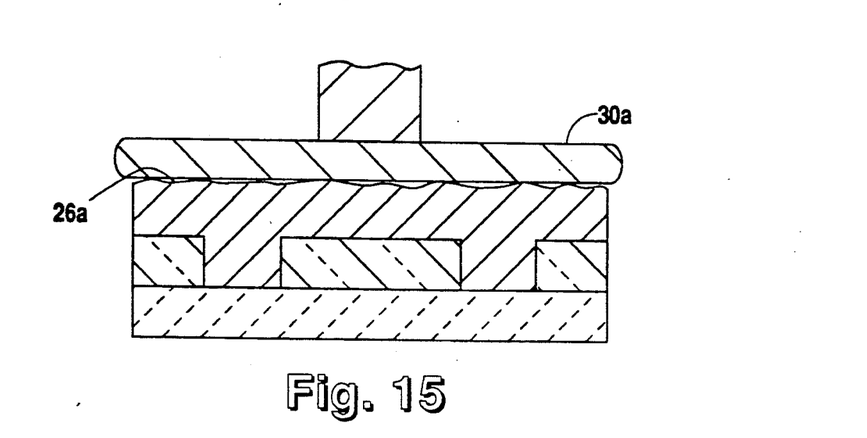

In FIG. 12 the designation 10a generally indicates an electrical interconnect. Interconnect 10a initially comprises an underlaying base 12a covered by a layer of dielectric 14a. In FIG. 13 vias 20a are formed in dielectric 14a. In FIG. 14 metal 24a is deposited into vias 20a and over dielectric top surface 16a to form a metal layer with an uneven top surface 26a. In FIG. 15 a rotating pad 30a and slurry (not shown) are applied to top metal surface 26a.

Figure 16:
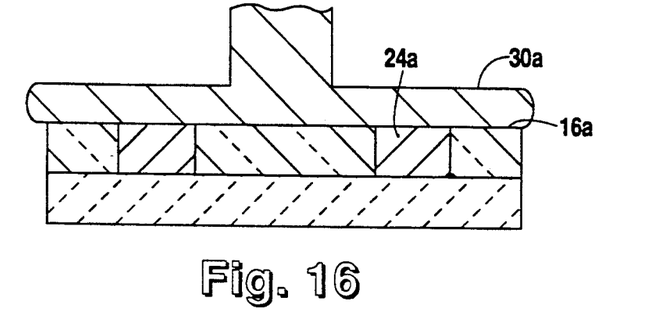
Figure 17:
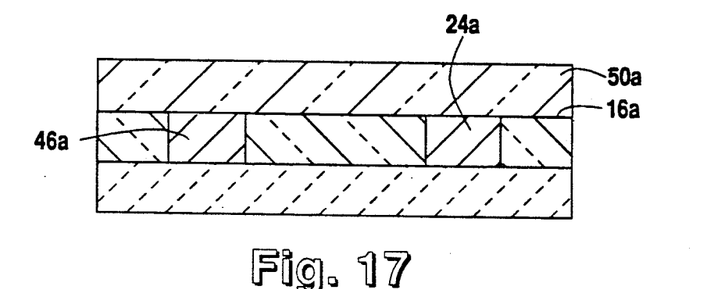

In FIG. 16 the first departure from the embodiment of FIGS. 1-11 is seen. Metal 24a is polished until all of metal 24a above dielectric top surface 16a is removed. That is, polishing is applied until a planarized top surface 16a consists of dielectric 14a and metal 24a in vias 20a. The top of metal 24a is in and aligned with the top of dielectric 14a to form a smooth surface. A small portion (not shown) of the dielectric top surface 16a and metal 24a in vias 20a may also be removed before polishing is completed. In FIG. 17 pad 30a and any slurry are removed from interconnect 10a. Preferably an additional layer of polyimide 50a is now coated over interconnect 10a.

In one experiment performed by Applicant, a 17 micron thick copper layer was removed in 62 minutes using a Westech polisher with a Diamex Alpha 125-015 pad at 6 PSI and 250 RPMs with a 0.05 CR Baikalox slurry 2:1 dispensed at 170 milliliters per minute. In another experiment using a Westech polisher with a Rodel H1 pad at 6 PSI and 250 RPMs and Rodel R90 slurry dispensed at 170 milliliters per minute a 17 micron copper/polyimide layer was removed in 10 minutes. In another experiment, a Westech polisher with a Rodel H1 perforated pad using a temperature control mode set at 125° F. and an average pressure of 15 PSI and 350 RPMs and Rodel 2371 slurry 1:1 with $NaClO_2$ dispensed at 150 milliliters per minute yielded a copper/polyimide polish selectivity of 6:1 with a 2 microns per minute copper polish rate. In each experiment, metallization beneath the removed layer was not damaged.

Figure 18:
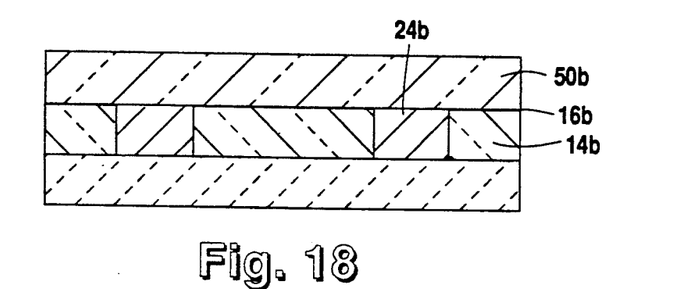
FIGS. 18-19 are fragmentary elevational views in cross-section illustrating successive manufacturing stages for fabricating metal pillars extending above a dielectric layer in accordance with another embodiment of the present invention.
Figure 19:
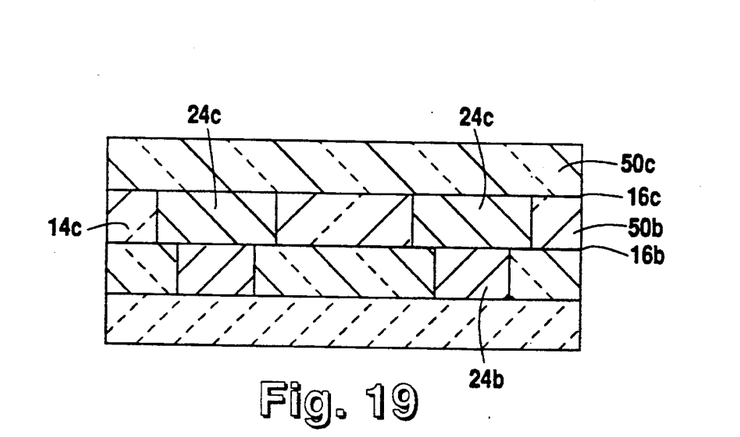

Referring now to FIGS. 18-19, there is shown another embodiment of the present invention in which the steps for FIGS. 12-17 are performed twice separately and in sequence to fabricate metal pillars extending above a dielectric layer to form a structure similar to FIG. 11.

In FIG. 18, the steps for FIGS. 12-17 are repeated wherein like parts are similarly numbered with the addition of the suffix "b". This yields metal pillars 24b in and aligned with dielectric surface 16b of dielectric layer 14b. Dielectric 50b is then coated over pillars 24b and surface 16b.

In FIG. 19, the steps for FIGS. 12-17 are repeated again wherein like parts are similarly numbered with the addition of the suffix "c". Metal pillars 24c are deposited on metal pillars 24b. In addition, metal pillars 24c are wider than pillars 24b. Dielectric layer 50b is also used as dielectric layer 14c, and pillars 24c and surface 16c are covered by dielectric 50c. The resultant structure is equivalent to that achieved in FIG. 11.

The present invention is also well suited for fabricating multilayer electrical interconnect structures. The previously described embodiments can be used to fabricate the bottom, middle, and/or top layers of a multilayer structure 52, as shown in FIGS. 20-22.

Figure 20:
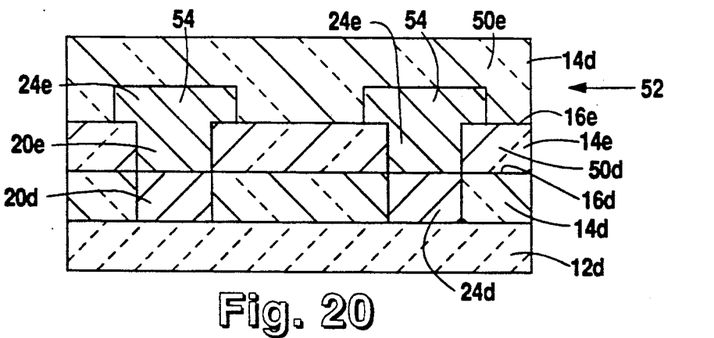
FIGS. 20-22 are fragmentary elevational views in cross-section illustrating successive manufacturing stages for fabricating metal pillars in a multilayer electrical interconnect in accordance with another embodiment of the present invention.

In FIG. 20, the steps for FIGS. 12-17 are repeated, wherein like parts are similarly numbered with the addition of the suffix "d", to form base 12d, dielectric 14d with top surface 16d and metal 24d therein. Surface 16d and metal 24d are covered with dielectric 50d. Then the steps for FIGS. 1-11 are repeated wherein like parts are similarly numbered with the addition of the suffix "e". As seen, dielectric 50d is also used as dielectric 14e. Prior to depositing metal 24e, the vias 20e expose at least a portion of the top of metal 24d in vias 20d. Thereafter the deposited metal 24e in each via 20e contacts the metal 24d in a single underlaying via 20d. This produces inter-layer metal pillars 54 comprising metal 24d and 24e. That is, pillars 54 extend through dielectrics 14d and 14e as well as above dielectric 14e. The interconnect is then coated with dielectric 50e.

Figure 21:
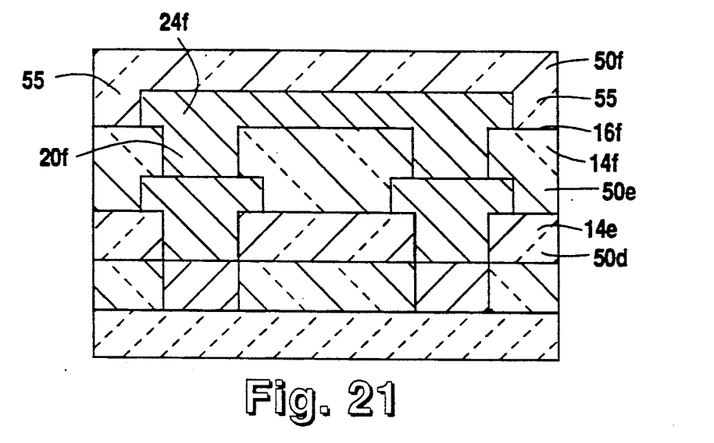

In FIG. 21, the steps for FIGS. 12-17 are repeated again to form a layer wherein like parts are similarly numbered with the addition of the suffix "f". Here dielectric 50e is also used as dielectric 14f which has metal 24f in and extending above dielectric surface 16f. For illustration purposes metal 24f between the depicted vias 20f has not been etched. However, metal 24f has been etched from regions 55 which lie between the depicted vias 24f other vias 24f (not shown) since, in practice, it would not make sense to short-circuit all the vias in a single layer.

Figure 22:
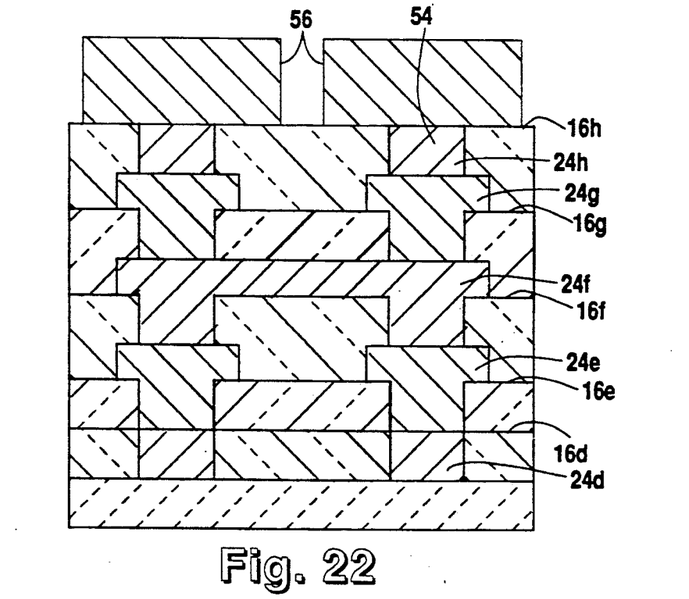

In FIG. 22, additional layers of dielectric and metal pillars are formed in accordance with the present invention. As illustrated, the steps for FIGS. 1-11 are repeated wherein like parts are similarly numbered with the addition of the suffix "g". Then the steps for FIGS. 12-17 are repeated wherein like parts are similarly numbered with the addition of the suffix "h". Finally, tin plated s copper bonding pads 56 are deposited over dielectric surface 16h and on inter-layer pillars 54. Pads 56 can electrically couple to surface mounted integrated circuit chips by tape-automated-bonding (TAB) leads. The resultant multilayer electrical interconnect 52 is seen to include a plurality of wiring layers with spaced inter-layer vertical metal pillars 54 therethrough. Metallization in various layers may be used for X-lines, Y-lines, power planes, or ground planes. For instance, metal 24d can form a ground layer, metal 24e above surface 16e can form X-lines, metal 24f above surface 16f can form Y-lines, and metal 24g above surface 16g can form a power layer. A preferred wiring structure for interconnect 52 is the customizable copper/polyimide substrate described in European Patent Application 88308996.3 entitled "Customizable Circuitry" by Carey and incorporated herein by reference.

The present invention need not be used to fabricate each layer of a multilayer structure. That is, some layers can be fabricated in accordance with the present invention, while other layers can be fabricated using conventional techniques known by those skilled in the art. For example, U.S. Pat. No. 4,810,332 entitled "Method of Making An Electrical Multilayer Copper Interconnect" by Pan discloses an additive method of making an electrical multilayer copper interconnect in which copper pillars are protected by an electroplated overcoat of nickel to avoid copper interdiffusion into the polyimide. In the '332 patent a plating interconnect is deposited on a substrate, a layer of dielectric material is deposited on the plating interconnect, and a plating mask is formed on the dielectric material. Copper pillars are then plated into vias in the mask and the mask is stripped. Before electroplating a diffusion barrier overcoat, the copper can be etched for exposing the sides adjacent the dielectric layer for allowing overcoating of all the copper. See also U.S. Pat. No. 5,071,518 entitled "Method of Making an Electrical Multilayer Interconnect" by Pan which is incorporated herein by reference. As another example, metal could be deposited so as to only partially fill the vias. Polishing could then be applied to planarize the dielectric top surface until enough dielectric is removed to assure that metal completely fills what remains of each via. A layer similar to FIG. 17 would result.

The present invention, therefore, is well adapted to carry out the objects and attain the ends and advantages mentioned, as well as others inherent therein. While presently preferred embodiments of the invention have been described for the purpose of disclosure, numerous changes in the details of construction, and steps of the process, will be readily apparent to those skilled in the art and which are encompassed within the spirit of the present invention and the scope of the appended claims.

What I claim is:

1. A method for fabricating metal pillars in an electronic component, comprising the following steps in the sequence set forth:
   providing a base with spaced vias in the top surface of the base;
   depositing an electrically conductive metal into the vias and over the top surface of the base so that a layer of the metal with an uneven top surface is formed over the top surface of the base;
   planarizing the top surface of the metal by polishing without removing all the metal over the top surface of the base; and
   removing metal above the top surface of the base between the vias, thereby forming separate metal pillars in the base which extend above the top surface of the base.

2. The method of claim 1 wherein the metal is deposited over the entire top surface of the base.

3. The method of claim 1 wherein the base is a dielectric.

4. The method of claim 3 wherein the dielectric is an epoxy or a polymer.

5. The method of claim 1 wherein the polishing is chemical-mechanical polishing.

6. The method of claim 1 wherein the polishing is mechanical polishing and includes a rotating pad and a slurry.

7. The method of claim 1 wherein the metal is selected from the group consisting of copper, nickel, titanium, gold, silver and aluminum.

8. The method of claim 1 wherein the metal is removed by etching.

9. The method of claim 8 wherein the etching is by a wet chemical etchant.

10. A method for fabricating metal pillars in a dielectric, comprising the following steps in the sequence set forth:
    providing a dielectric with spaced vias in a planar top surface;
    depositing an electrically conductive metal into the vias and over the top surface of the dielectric so that the deposited metal fills the vias and forms a layer with an uneven top surface over the dielectric;
    polishing the metal to planarize the top surface of the metal while leaving the metal over the top surface of the dielectric; and
    etching the metal to remove metal from the top surface of the dielectric between the vias, thereby forming separate metal pillars in the dielectric which extend above the top surface of the dielectric and have uniform heights.

11. The method of claim 10 wherein the dielectric is a radiation curable epoxy or polymer.

12. The method of claim 10 wherein the dielectric is selected from the group consisting of polyimide and benzocyclobutene.

13. The method of claim 10 wherein the polishing includes a rotating pad and a slurry.

14. The method of claim 10 wherein the metal is selected from the group consisting of copper, nickel, titanium, gold, silver and aluminum.

15. A method for fabricating metal pillars in an electrical interconnect, comprising the following steps in the sequence set forth:
    providing a planar radiation curable dielectric on a base;
    forming a plurality of vertical vias spaced from one another in the top of the dielectric;
    depositing an electrically conductive metal into the vias and on top of the dielectric so that the metal fills the vias and forms a metal layer with an uneven top over the top of the dielectric;
    applying a rotating pad and a slurry to the top of the metal to planarize the top of the metal without contacting the pad to the top of the dielectric;
    removing the pad and the slurry from the metal;
    applying a photoresist mask over the top of the metal;
    forming openings in the mask to expose portions of the metal between the vias;
    etching the exposed metal above the dielectric between the vias through the mask openings with a wet chemical etchant so that the unetched metal forms spaced metal pillars in the dielectric which extend above the top of the dielectric and have uniform heights; and
    stripping the mask.

16. The method of claim 15 wherein the metal is selected from the group consisting of copper, nickel, titanium, gold, silver and aluminum.

17. The method of claim 15 wherein the dielectric is selected from the group consisting of epoxy, polyimide and benzocyclobutene.

18. The method of claim 15 wherein the pad is composed of a felt fiber fabric impregnated with polyurethane.

19. The method of claim 15 wherein the pad is composed of blown polyurethane.

20. A method for fabricating metal pillars in a multilayer electrical interconnect, comprising the following steps in the sequence set forth:

providing a planar layer of a first radiation curable dielectric on a base;
forming a plurality of first vertical vias spaced from one another in the top of the first dielectric;
depositing a first electrically conductive metal into the first vias;
applying a first rotating pad and a first slurry to the top of the electrical interconnect until the top of the interconnect is planarized and the first metal completely fills the first vias;
removing the first pad and the first slurry from the electrical interconnect;
providing a planar layer of a second radiation curable dielectric on top of the electrical interconnect;
forming a plurality of second vertical vias spaced from one another in the top of the second dielectric, wherein each second vertical via exposes at least a portion of the first metal in a single underlaying first vertical via;
depositing a second electrically conductive metal into the second vias and on top of the second dielectric so that the second metal contacts the exposed first metal, fills the second vias and forms a second metal layer with an uneven top over the top of the second dielectric;
applying a second rotating pad and a second slurry to the top of the second metal to planarize the top of the second metal without contacting the pad to the top of the second dielectric;
removing the second pad and the second slurry from the second metal;
applying a photoresist mask over the top of the second metal;
forming openings in the mask to expose portions of the second metal between the second vias;
etching the exposed second metal above the second dielectric between the second vias through the mask openings with a wet chemical etchant; and
stripping the mask, wherein the first and unetched second metals form spaced vertical metal pillars in the first and second dielectrics which extend above the top of the second dielectric.

21. A method for fabricating metal pillars in a multilayer electrical interconnect, comprising the following steps in the sequence set forth:

providing a planar layer of a first radiation curable dielectric on a base;
forming a plurality of first vertical vias spaced from one another in the top of the first dielectric; depositing a first electrically conductive metal into the first vias and on top of the first dielectric so that the first metal fills the first vias and forms a first metal layer with an uneven top over the top of the first dielectric;
applying a first rotating pad and a first slurry to the top of the first metal to remove all the first metal above the top of the first dielectric and to planarize the top of the electrical interconnect;
removing the first pad and the first slurry from the electrical interconnect;
providing a planar layer of a second radiation curable dielectric on top of the electrical interconnect;
forming a plurality of second vertical vias spaced from one another in the top of the second dielectric, wherein each second vertical via exposes at least a portion of the first metal in a single underlaying first vertical via;
depositing a second electrically conductive metal into the second vias and on top of the second dielectric so that the second metal contacts the exposed first metal, fills the second vias and forms a second metal layer with an uneven top over the top of the second dielectric;
applying a second rotating pad and a second slurry to the top of the second metal to planarize the top of the second metal without contacting the pad to the top of the second dielectric;
removing the second pad and the second slurry from the second metal;
applying a photoresist mask over the top of the second metal;
forming openings in the mask to expose portions of the second metal between the second vias;
etching the exposed second metal above the second dielectric between the second vias through the mask openings with a wet chemical etchant; and
stripping the mask, wherein the first and unetched second metals form spaced vertical metal pillars in the first and second dielectrics which extend above the top of the second dielectric and have uniform heights.

22. A method for fabricating metal pillars in an electronic component, comprising the following steps in the sequence set forth:

providing a dielectric with spaced vias in a top surface;
depositing an electrically conductive metal into the vias and over the top surface of the dielectric so that metal pillars form in the vias and a metal layer forms over the top surface of the dielectric;
planarizing the metal by polishing so that the metal layer is removed and the planar tops of the metal pillars are in and aligned with the top surface of the dielectric;
depositing a second dielectric on the metal pillars and the top surface of the dielectric;
forming spaced second vias in the top surface of the second dielectric, wherein each second via exposes the top of a metal pillar and is wider than the exposed metal pillar;
depositing a second electrically conductive metal in the second vias and over the top surface of the second dielectric so that second metal pillars form in the second vias and a second metal layer forms over the top surface of the second dielectric; and
planarizing the second metal by polishing so that the second metal layer is removed, the planar tops of the second metal pillars are in and aligned with the top surface of the second dielectric, and each second metal pillar is electrically connected to an underlying first metal pillar.

* * * * *